US009941987B2

(12) United States Patent
Bellingham et al.

(10) Patent No.: US 9,941,987 B2
(45) Date of Patent: Apr. 10, 2018

(54) SINGLE KNOB PRE-AMPLIFIER GAIN-TRIM AND FADER

(71) Applicant: Crestron Electronics, Inc., Rockleigh, NJ (US)

(72) Inventors: Philip Bellingham, White Plains, NY (US); Krunoslav Draganovic, Newark, DE (US)

(73) Assignee: Crestron Electronics, Inc., Rockleigh, NJ (US)

( * ) Notice: Subject to any disclaimer, the term of this patent is extended or adjusted under 35 U.S.C. 154(b) by 0 days.

(21) Appl. No.: 15/496,247

(22) Filed: Apr. 25, 2017

(65) Prior Publication Data

US 2017/0353252 A1 Dec. 7, 2017

Related U.S. Application Data

(60) Provisional application No. 62/345,284, filed on Jun. 3, 2016.

(51) Int. Cl.
| | |
|---|---|
| *H04B 1/00* | (2006.01) |
| *H04R 3/00* | (2006.01) |
| *H04H 60/04* | (2008.01) |
| *H04R 3/04* | (2006.01) |
| *H03G 5/02* | (2006.01) |
| *H04R 1/04* | (2006.01) |

(52) U.S. Cl.
CPC ............ *H04H 60/04* (2013.01); *H03G 5/025* (2013.01); *H04R 3/04* (2013.01); *H04R 1/04* (2013.01); *H04R 3/005* (2013.01)

(58) Field of Classification Search
CPC ...... H04H 60/04; G11B 27/34; G11B 27/028; G11B 27/034; G11B 27/038; H04R 3/00;
(Continued)

(56) References Cited

U.S. PATENT DOCUMENTS 3,992,584 A * 11/1976 Dugan ............... H03G 1/02
381/107
4,357,492 A * 11/1982 Campbell ............ H03G 3/3005
381/107
(Continued)

*Primary Examiner* — Xu Mei
(74) *Attorney, Agent, or Firm* — Crestron Electronics, Inc

(57) ABSTRACT

According to a first aspect of the embodiments, a microphone mixer is provided comprising: an input adapted to receive differential microphone (mic) output signals; a gain-trim circuit adapted to receive the differential mic output signals, and which includes a substantially fully differential amplifier adapted to amplify the received differential mic output signals through use of a gain-trim output adjustment device that provides a variable gain amount ranging from a first gain-trim gain value to a second gain-trim gain value, to produce differential gain-trim circuit output signals; a fader circuit adapted to receive the differential gain-trim circuit output signals, and which includes a differential amplifier adapted to attenuate the received differential gain-trim circuit output signals through use of a fader output adjustment device that provides a variable gain amount ranging from a first fader gain value to a second fader value; and a common adjustment apparatus that mechanically ties the gain-trim output adjustment device with the fader output adjustment device such that the first gain-trim gain value and first fader gain value are obtained substantially simultaneously at a first position of the common adjustment apparatus, and the second gain-trim gain value and second fader gain value are obtained substantially simultaneously at a second position of the common adjustment apparatus.

7 Claims, 6 Drawing Sheets

(58) Field of Classification Search
CPC . H04R 3/005; H04R 3/04; H04R 1/04; H04R 1/08; H04R 1/406; H03F 3/68; H03F 3/181; H03F 3/217; H03F 3/72; H03F 2200/03
USPC ............ 381/119, 95, 91, 92, 122, 123, 120, 381/111–115; 369/4, 3; 84/625, 660; 330/254, 278, 86
See application file for complete search history.

(56) References Cited

U.S. PATENT DOCUMENTS

| | | | | | |
|---|---|---|---|---|---|
| 4,864,627 | A | * | 9/1989 | Dugan | H03G 7/00 381/106 |
| 5,259,035 | A | * | 11/1993 | Peters | H04R 3/005 379/202.01 |
| 5,652,800 | A | * | 7/1997 | Roberts | H03G 3/301 381/119 |
| 5,673,327 | A | * | 9/1997 | Julstrom | H04H 60/04 381/110 |
| 6,507,659 | B1 | * | 1/2003 | Iredale | H04R 3/005 381/111 |
| 7,352,242 | B1 | * | 4/2008 | Hughes | H03F 1/34 330/254 |
| 7,605,659 | B2 | * | 10/2009 | Hughes | H03F 3/45475 330/254 |
| 8,644,477 | B2 | * | 2/2014 | Gilbert | H04R 3/005 379/202.01 |

* cited by examiner

SINGLE KNOB PRE-AMPLIFIER GAIN-TRIM AND FADER

PRIORITY INFORMATION

The present application claims priority under 35 U.S.C. § 119(e) to U.S. Provisional Patent Application Ser. No. 62/345,284, filed 3 Jun. 2016, the entire contents of which are expressly incorporated herein by reference.

BACKGROUND OF THE INVENTION

Technical Field

Aspects of the embodiments relate to audio components, and more particularly to pre-amplifiers. The embodiments described herein relate generally to audio components, and more specifically to systems, methods, and modes for simultaneously providing gain-trim and fader functions in pre-amplifier audio components.

Background Art

Microphone pre-amplifiers often have a gain-trim to accommodate the different output levels of various microphones while maintaining adequate noise and distortion performance. They also require a separate fader to allow the level of the channel to be lowered to an inaudible level. Some pre-amplifier devices currently available include a "set and forget" application in which there is a need for a gain-trim, but still want to be able to make the channel inaudible, and do not have the physical room to allow for two separate controls.

Existing solutions eliminate the gain-trim control, and have only the fader control. This places a high level of gain upfront for all microphones that increases the noise level and the total harmonic distortion (THD).

Accordingly, a need has arisen for simultaneously providing gain-trim and fader functions in pre-amplifier audio components.

SUMMARY

It is an object of the embodiments to substantially solve at least the problems and/or disadvantages discussed above, and to provide at least one or more of the advantages described below.

It is therefore a general aspect of the embodiments to provide systems, methods, and modes for simultaneously providing gain-trim and fader functions in pre-amplifier audio components that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, a microphone gain-trim and fader circuit is provided comprising: a plurality of filters adapted to provide a bandpass filter function such that only a predetermined frequency range of input signals is allowed to propagate through to the output of the circuit; a differential amplifier adapted to provide a variable gain to the input signals, the variable gain ranging from a first positive gain value to a second positive gain value of the input signals; a fader amplifier adapted to provide a variable attenuation or alternatively variable attenuation and gain to the signals input to the fader amplifier, the fader amplifier accepting as an input the output of the differential amplifier, the variable attenuation or alternatively variable attenuation and gain of the fader mechanically tied to the variable gain of the differential amplifier such that at a first lowest variable gain setting of the variable attenuation of the fader, the variable gain of the gain-trim is at its lowest variable gain, and further wherein at a second highest variable gain setting of the variable attenuation of the fader, the variable gain of the gain-trim is at its highest variable gain.

According to a first aspect of the embodiments, a microphone mixer is provided comprising: an input adapted to receive differential microphone (mic) output signals; a gain-trim circuit adapted to receive the differential mic output signals, and which includes a substantially fully differential amplifier adapted to amplify the received differential mic output signals through use of a gain-trim output adjustment device that provides a variable gain amount ranging from a first gain-trim gain value to a second gain-trim gain value, to produce differential gain-trim circuit output signals; a fader circuit adapted to receive the differential gain-trim circuit output signals, and which includes a differential amplifier adapted to attenuate the received differential gain-trim circuit output signals through use of a fader output adjustment device that provides a variable gain amount ranging from a first fader gain value to a second fader value; and a common adjustment apparatus that mechanically ties the gain-trim output adjustment device with the fader output adjustment device such that the first gain-trim gain value and first fader gain value are obtained substantially simultaneously at a first position of the common adjustment apparatus, and the second gain-trim gain value and second fader gain value are obtained substantially simultaneously at a second position of the common adjustment apparatus.

According to the first aspect of the embodiments, the microphone mixer further comprises a plurality of filters adapted to provide a bandpass filter function such that only a predetermined frequency range of input signals is allowed to propagate through to the output of the microphone mixer.

According to the first aspect of the embodiments, the first gain-trim gain value is a lowest positive first gain-trim gain value, the second gain-trim gain value is a highest positive gain-trim gain value, the first fader gain value is a largest negative fader gain value, and the second fader gain value is a fader gain value that does not substantially change the output of the fader circuit in view of the input of the fader circuit.

According to the first aspect of the embodiments, the gain-trim output adjustment device comprises a natural logarithmic scaled gain, and the fader output adjustment device comprise a linearly scaled potentiometer.

According to the first aspect of the embodiments, the gain-trim output adjustment device comprises a natural logarithmic scaled gain, and the fader output adjustment device comprise an anti-logarithmic scaled potentiometer.

According to the first aspect of the embodiments, the gain-trim circuit is further adapted to variably attenuate the received differential mic output signals.

According to the first aspect of the embodiments, the fader circuit is further adapted to variably amplify the received differential gain-trim circuit output signals.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

DETAILED DESCRIPTION

Figure 1:
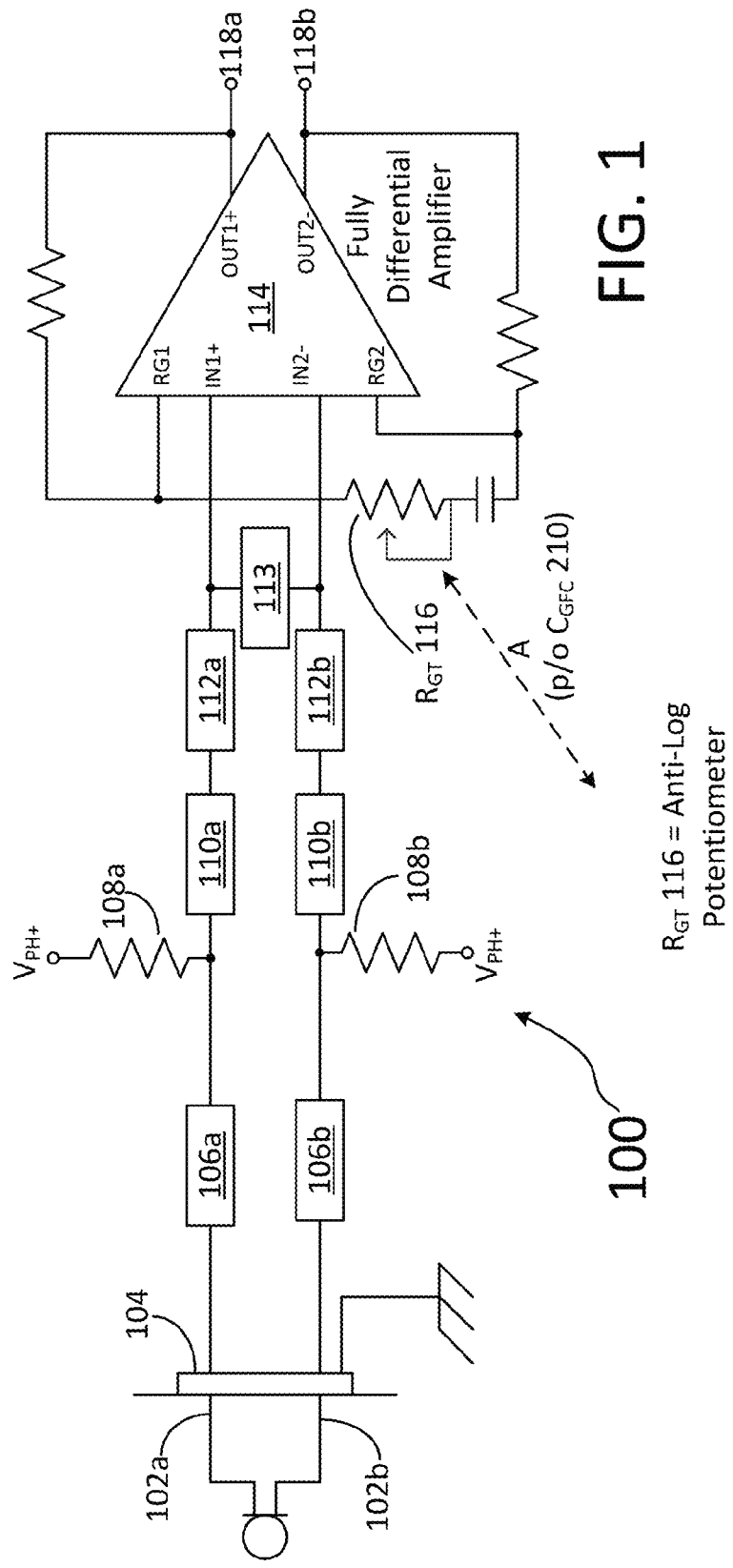
FIG. 1 illustrates a block diagram of a gain-trim circuit using a fully differential amplifier according to aspects of the embodiments.

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as audio preamplifiers.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" on "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.
100 Gain-Trim Circuit Block Diagram (Gain-trim Circuit)
102a,b Input Signals
104 Input Connector
106 Low Pass Filter (LPF)
108a,b Phantom Voltage Source ($V_{PH}$)
110a,b High Pass Filter (HPF)
112a,b Over Voltage Protection (OVP) Circuit
113a,b Second Low Pass Filter (Second LPF)
114 Fully Differential Amplifier (FD-Amp)
116 Adjustable Gain-Trim Potentiometer ($R_{GT}$)
118a,b Gain-Trim Circuit Output Signals (Mic Gain Out +/−)
200 Fader Circuit Block Diagram (Fader Circuit)
202 Differential Amplifier (Diff-Amp)
204 Adjustable Fader Potentiometer ($R_F$)
206 Fader Circuit Output (Mic Output)
210 Combined Gain-Trim Fader Control ($C_{GFC}$)
302 First Gain Curve
304 Second Gain Curve
306 Third Gain Curve
400 Detailed View of Gain-Trim Circuit Block Diagram
600 Detailed View of Fader Circuit Block Diagram

LIST OF ACRONYMS USED IN THE SPECIFICATION IN ALPHABETICAL ORDER

The following is a list of the acronyms used in the specification in alphabetical order.
AC Alternating Current
ADC Analog-to-Digital Converter
Amp Amplifier
BPF Band Pass Filter
dB Decibel
DC Direct Current
DIFF Differential (Amplifier)
FD Fully Differential
HPF High Pass Filter
LPF Low Pass Filter
Mic Microphone
OVP Over Voltage Protection
RF Radio-Frequency
SNR Signal-to-Noise Ratio THD Total Harmonic Distortion The different aspects of the embodiments described herein pertain to the context of audio components, and more specifically to systems, methods, and modes for simultaneously providing gain-trim and fader functions in pre-amplifier audio components, but is not limited thereto, except as may be set forth expressly in the appended claims.

For 40 years Creston Electronics Inc., has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein, as embodied as MXR6-USB and MMX-6-USB, can be manufactured by Crestron Electronics Inc., located in Rockleigh, N.J., and have been marketed and sold as a microphone mixer and preamp for Crestron RL® 2 and other applications (See, e.g., http://www.crestron.com/products/model/MMX-6-USB)

FIG. 1 illustrates a block diagram of gain-trim circuit 100 according to aspects of the embodiments. Prior to discussing FIGS. 1 and 2 in particular, a general discussion of microphone preamplifiers circuits and fader circuits will be provided in order to facilitate understanding of the need for various aspects of the embodiments (see, FIGS. 1, 4, and 5 in regard to gain-trim circuits, and FIGS. 2 and 6 in regard to fader circuits). Microphone (mic) preamplifier designs usually need to satisfy many challenging requirements. These include low noise performance with low source impedances, high signal-handling capability, high radio-frequency (RF) immunity, high common-mode signal rejection, and variable differential gain over a range of 1 to 1,000 (or more). Mic preamps are often required to serve "double duty" as line input stages. In addition, professional mic preamps very often need to supply a source of phantom power, usually +48V, to the microphone. The presence of phantom power mandates protection networks (e.g., over-voltage protection circuits), which tend to conflict with some of the above-described design goals.

As those of skill in the art can appreciate, if the microphone's output signal is weak, then the mic preamp circuit should provide a robust amount of gain; however, if the microphone's output signal becomes too strong, then too much THD is generated. Faders provide a means for diminishing the pre-amp's output. According to aspects of the embodiments, in the range of adjustment that corresponds to 0 dB through-gain and below, the amount of gain introduced is relatively low; the over-all gain becomes significant in any gain settings above about 0 dB. Thus, fader's normally do not provide any positive gain, but can only decrease or reduce the magnitude of the input signal. According to aspects of the embodiments, increasing the attenuation of the fader simultaneously reduces the gain of the gain trim circuit before the fader. According to further aspects of the embodiments, it is this reduction in gain of the fully differential amplifier that results in the improved THD, not the attenuation from the fader. Thus, according to aspects of the embodiments, at least one purpose for the fader circuit is to have a means to reduce the level of the output to one that is substantially inaudible. According to further aspects of the embodiments, therefore, the taper of the one or more potentiometers in the fader circuit is either linear or anti-logarithmic, rather than the logarithmic taper (so-called "audio taper") commonly found in the fader circuit of preamplifiers and mixing consoles of the prior art.

Fader circuits typically have a "negative" gain (or attenuation) ranging from about 0 dB to between about −90 dB to about −100 dB (meaning the "gain" of the fader is more technically written as an attenuation that ranges from about 0 dB (i.e., substantially no attenuation) to about −90 dB. In some applications, the attenuation can be about −100 dB. In some applications, it may be desirable for the fader amplifier to provide gain at its highest setting. According to still further aspects of the embodiments, there can be a gain that ranges from about +5 dB to about −90/−100 dB.

As shown in FIG. 1, differential input signals (input signals) 102a,b are received at input connector 104, and the shield of the cable carrying differential input signals 102a,b is shunted to ground. Input signals 102a,b are first applied to low pass filters (LPF) 106a,b, respectively, which, according to aspects of the embodiments, can be fabricated in the form of an inductor-capacitor filter circuit, as shown and described in greater detail below, in regard to FIG. 4. Following LPFs 106a,b, there are respective phantom voltage supplies, $V_{PH}$ 108a,b (one for each of the differential input signals). As those of skill in the art can appreciate, many, if not most of currently available microphones are electret condenser type microphones and therefore need a bias voltage. Phantom power, in the context of professional audio equipment, is DC electric power transmitted through microphone cables to operate microphones that contain active electronic circuitry. It is known by those of skill in the art to use phantom power supplies as a convenient power source for electret condenser microphones, though many active direct boxes also use it, for other purposes.

Following the $V_{PH}$ phantom voltage sources 108a,b, there are over-voltage protection (OVP) circuits 112a,b and high pass filters (HPF) 110a,b. OVP circuits 112a,b protect fully differential amplifier (FD-Amp) 114 further down the circuit from over voltage conditions, and HPF 110a,b provides a further filtering function, e.g., HPFs 110a,b provide an alternating current (AC) coupling or direct current (DC) block function to isolate the inputs of FD-Amp 114 from the phantom power. Using both LPFs 106a,b and HPFs 110a,b provide a band-pass filter (BPF) function that substantially prevents frequencies outside a predefined bandwidth from being amplified by FD-Amp 114, thereby decreasing "noise," increasing the signal-to-noise ratio (SNR), and decreasing THD according to aspects of the embodiments.

Figure 3:
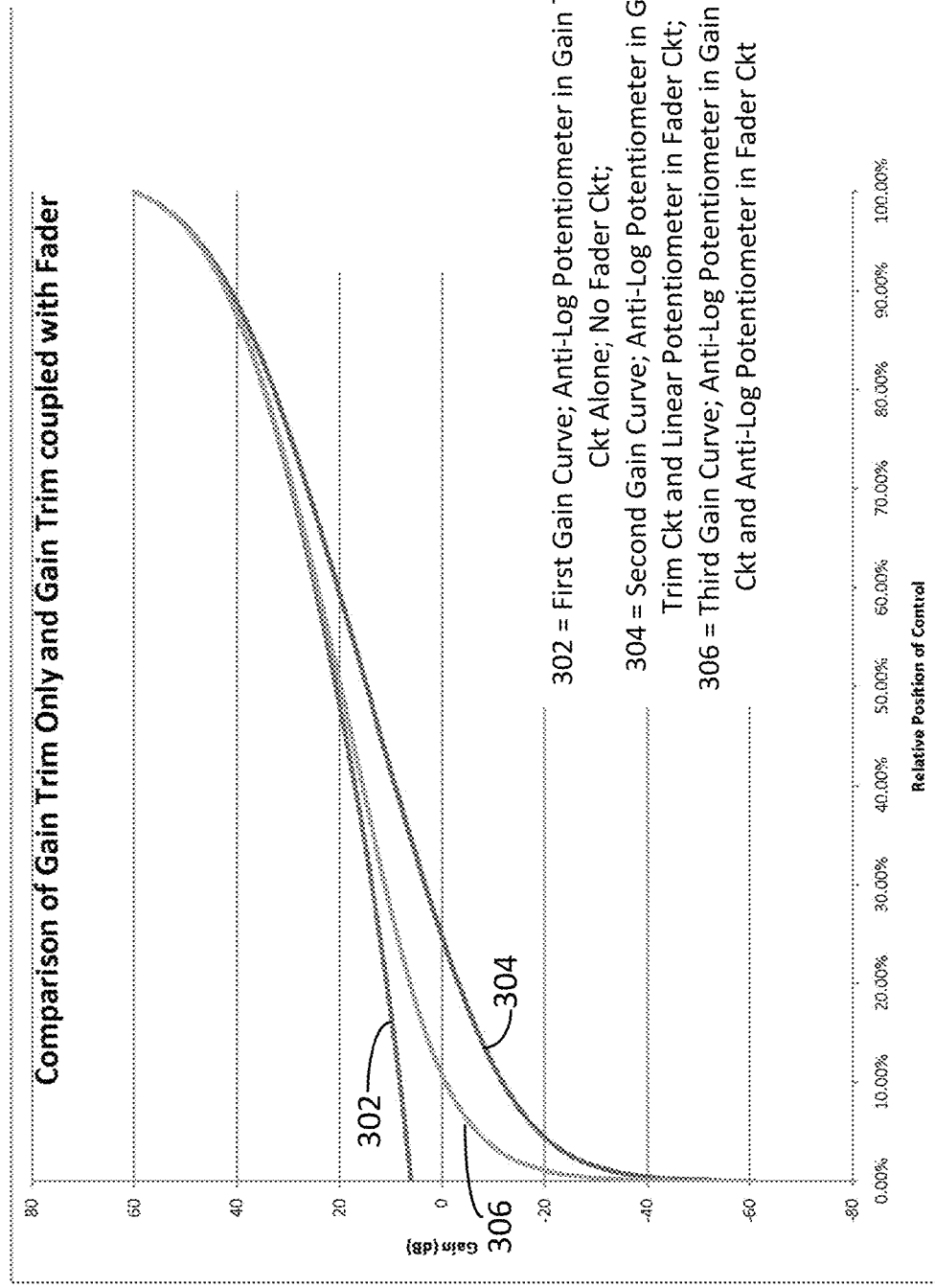
FIG. 3 illustrates several gain plots on a single graph, including a first gain plot of a simple gain-trim only circuit with an anti-logarithmic scaled potentiometer in a feedback path of a fully differential amplifier, a second gain plot of a combined gain-trim and fader circuit with an anti-logarithmic scaled potentiometer in the feedback path of a fully differential amplifier in the gain-trim circuit, and a linearly scaled potentiometer in the output path of a differential amplifier in the fader circuit, and a third gain plot of a combined gain-trim and fader circuit with an anti-logarithmic scaled potentiometer in the feedback path of a fully differential amplifier in the gain-trim circuit, and an anti-logarithmic scaled potentiometer in the output path of the differential amplifier in the fader circuit, according to aspects of the embodiments.
Figure 4:
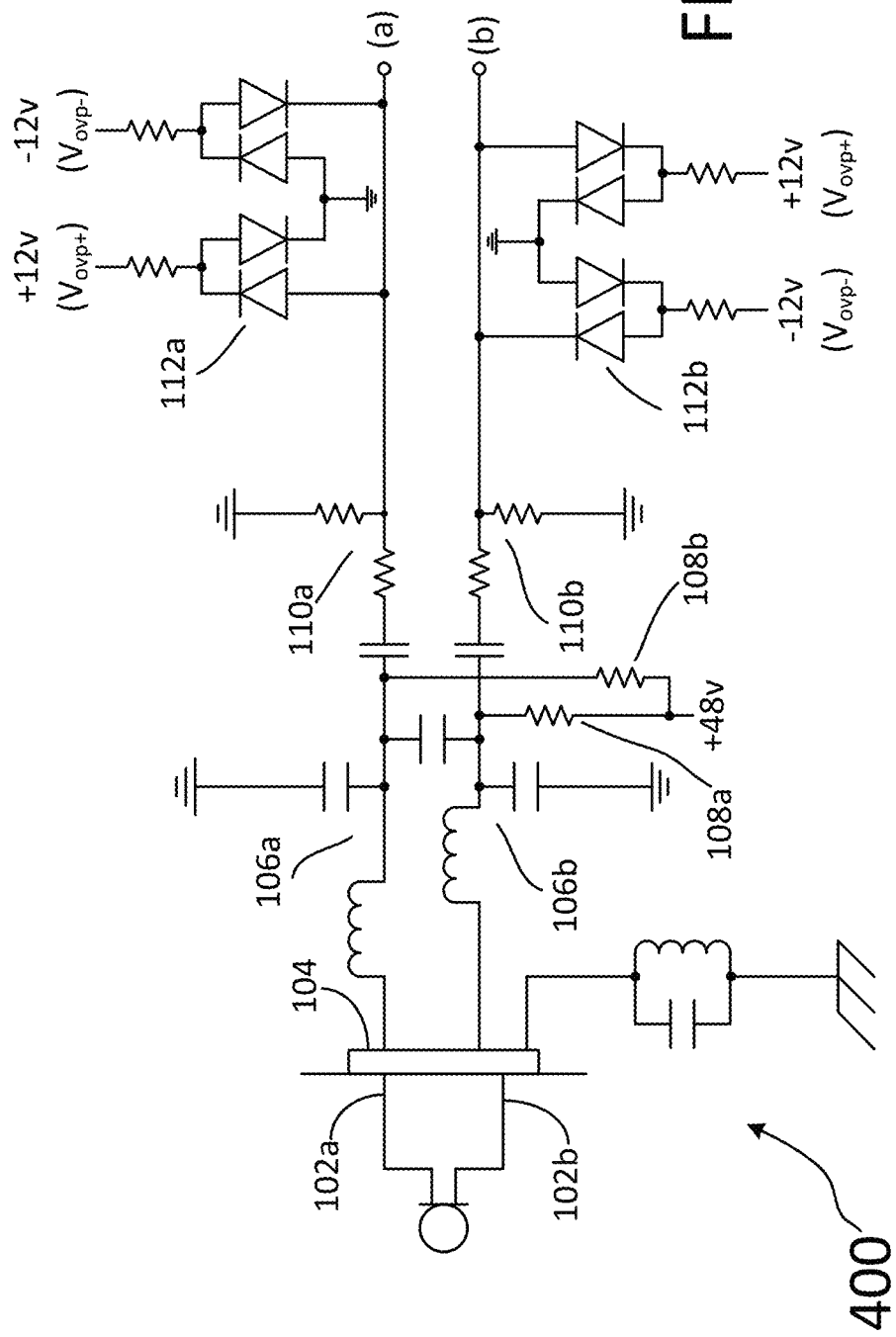
FIG. 4 illustrates a detailed first partial view of an electrical schematic of the gain-trim circuit as shown in the block diagram of FIG. 1 according to aspects of the embodiments.
Figure 5:
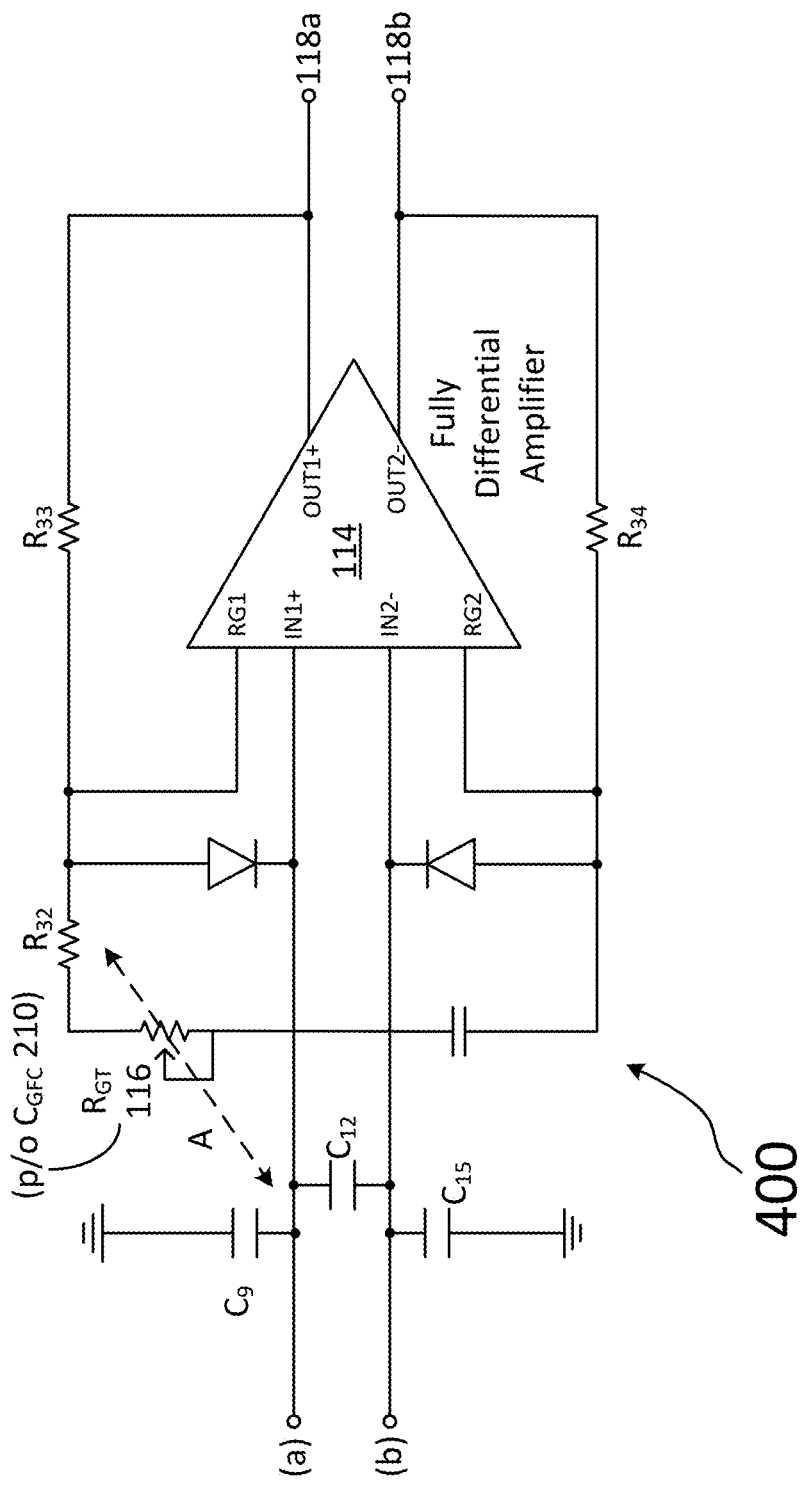
FIG. 5 illustrates a detailed second partial view of the electrical schematic of the gain-trim circuit as shown in the block diagram of FIG. 1 using a fully differential amplifier according to aspects of the embodiments.

Following the filtering functions provided by HPFs 112a,b, and LFPs 113 (to reduce radio frequency (RF) interference after OVP circuits 112a,b, and which comprises C9, C12, and C15 as shown in FIG. 5), the filtered microphone output signals are input to FD-Amp 114. A detailed discussion of the operation of FD-Amp 114 is provided below, in regard to FIG. 5. FD-Amp 114, as configured in the manner shown in FIG. 1 (and FIGS. 4 and 5 below) provides about 6-60 dB in total gain, as gain trim curve 302 of FIG. 3 illustrates, which is a graph of the gain of gain-trim circuit 100 alone, without the fader circuit, according to aspects of the embodiments. FD-Amp 114 always provides at least about 6 dB of gain, meaning there is never a gain of less than about 6 dB. As those of skill in the art can appreciate, such gain values are by way of non-limiting examples only, as other minimum and maximum gain values can be implemented with the proper selection of components, including both passive and active components. At its upper limit of maximum gain, FD-Amp 114 provides about 60 dB of gain. Adjustable gain-trim potentiometer ($R_{GT}$) 116 provides the variable gain portion of FD-Amp 114; that is, as the resistance varies with the turning of the shaft, the gain of FD-Amp 114 (gain-trim circuit 100) changes, as well as the gain of fader circuit 200 as described below in regard to FIGS. 2 and 6. According to aspects of the embodiments, $R_{GT}$ 116 is adapted to be an anti-logarithmic potentiometer.

Figure 2:
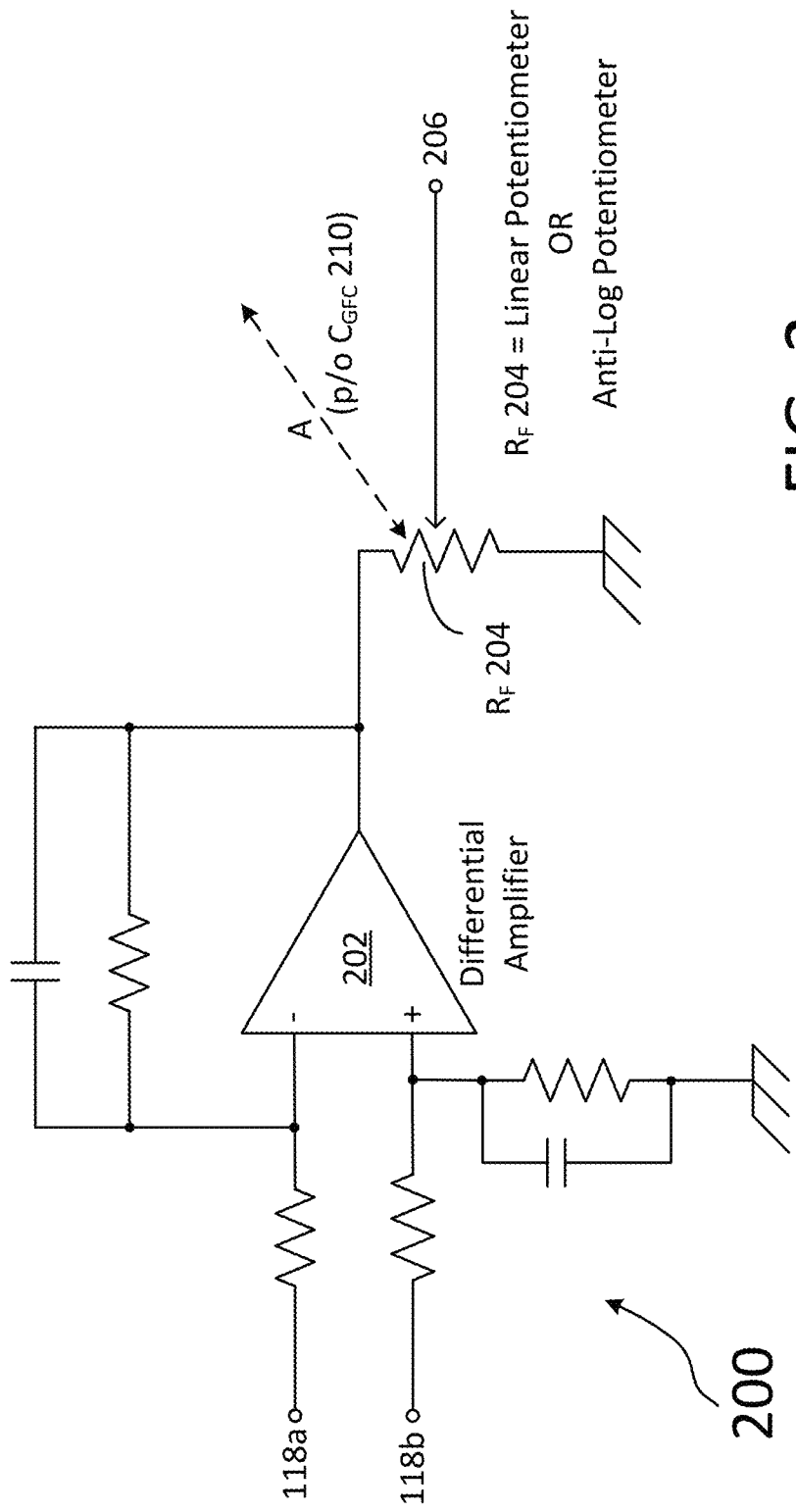
FIG. 2 illustrates a block diagram of a fader circuit using a differential amplifier according to aspects of the embodiments.

Attention is now directed to FIG. 2, and fader circuit 200 according to aspects of the embodiments. Outputs 118a,b of FD-Amp 114 of gain-trim circuit 100 become the inputs of fader circuit 200, and differential amplifier (Diff-Amp) 202. Diff-Amp 202, using potentiometer $R_F$ 204 as a variable control of its gain, provides a gain that ranges from about −90 dB/−100 dB to about 0 dB. As discussed above, in some configurations, fader circuit 200 is designed and implemented to provide an attenuation of about 100 dB (or −100 dB of gain); in fulfillment of the dual purposes of clarity and brevity, discussion shall be made of fader circuit 200 and Diff-Amp 202 as providing only 90 dB of attenuation (or −90 dB of gain). As arrows A in FIGS. 1 and 2 indicate, the same mechanical shaft that turns potentiometer $R_{GT}$ 116 also turns potentiometer $R_F$ 204. According to aspects of the embodiments, due to the linked nature of $R_{GT}$ 116 and $R_F$ 204, from hereon in they shall be referred to as "combined gain-trim fader controller ($C_{GFC}$) 210."

Figure 6:
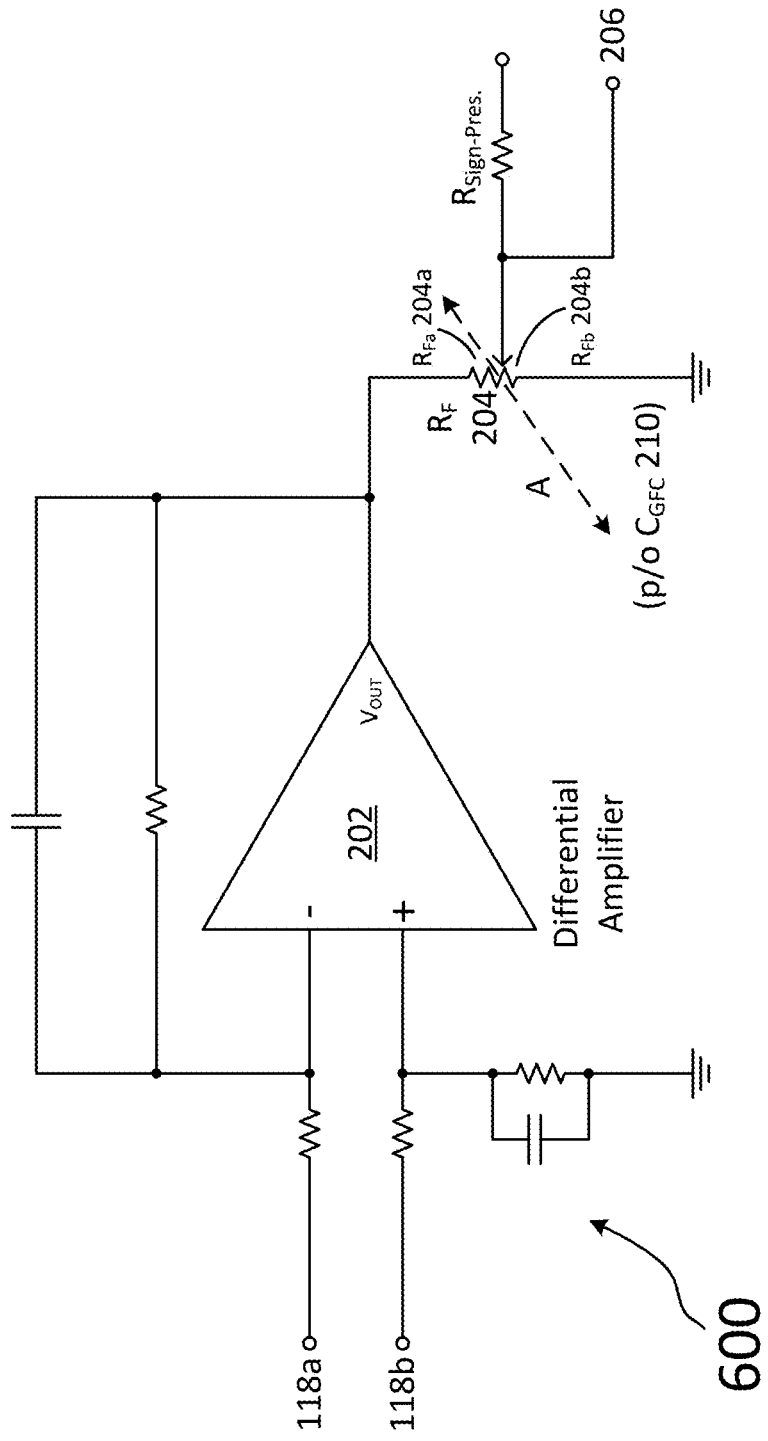
FIG. 6 illustrates a detailed electrical schematic of the fader circuit as shown in the block diagram of FIG. 2 using a differential amplifier according to aspects of the embodiments.

Aspects of the embodiments physically lock the gain-trim control of front-end gain-trim circuit 100 (which is substantially similar to circuit 400 as shown in FIGS. 4 and 5) with the downstream attenuation control of fader circuit 200 (which is substantially similar to circuit 600 as shown in FIG. 6) to a single mechanical shaft. Because the two potentiometers are tied together by one shaft, adjusting one ($R_{GT}$ 116) adjusts the other ($R_F$ 204). In this manner, when $R_{GT}$ 116 of gain-trim circuit 200 (and circuit 400) is turned to its lowest gain (about 6 dB), so too is $R_F$ 204 of fader circuit 200 (and circuit 600) turned to its lowest gain, of about −90 dB. When turned all the way to its other limit, $R_{GT}$ 116 provides about 60 dB of gain, while fader potentiometer $R_F$ 204 provides about 0 dB of gain (meaning the input and output are substantially similar in terms of magnitude—i.e., no gain). In some applications, however, it may be desirable for Diff-Amp 202 to provide a true gain (e.g., a gain of about 10 dB (or positive amplification of the input signal)). According to aspects of the embodiments, tying the two gains together via a single control provides for high attenuation of the input signal when the channel should be inaudible. According to further aspects of the embodiments, tying the two gains together via a single control provides for a lower gain for high level input signals resulting in lower distortion and improved SNR. According to still further aspects of the embodiments, tying the two gains together via a single control affords higher gain for low level input signals.

In known or existing pre-amp and fader circuits, the channel gain-trim and the channel fader are separate controls. The gain-trim control is usually a reverse audio taper (anti-log) control, which results in an audio taper (log) response from the first gain-trim stage of the pre-amplifier (because the gain-trim device is in the inverse feedback loop of the amplifier). The gain-trim control usually provides gain-trim control in the range of 30 dB to 50 dB. The fader control is usually an audio taper (log) control with the lowest end of the range resulting in attenuation of the signal by at least 90 dB with respect to the full output signal level. Typically in the fader circuit, the fader control is not in the feedback loop, should one even be in use.

The circuits designed and fabricated according to aspects of the embodiments mechanically couples the two controls ($R_{GT}$ 116 and $R_F$ 204) together. This results in a range from greater than about −80 dB of attenuation to a gain of about +60 dB using a single knob. According to aspects of the embodiments, because the two controls are coupled, the fader portion can be an anti-log taper or, alternatively, a linear taper.

FIG. 3 illustrates several gain plots (gain curves) 302, 304, 306 on a single graph, including first gain curve 302 of a simple gain-trim only circuit with an anti-log scaled potentiometer in a feedback path of a fully differential amplifier, second gain curve 304 of a combined gain-trim and fader circuit with an anti-log scaled potentiometer in the feedback path of a fully differential amplifier in the gain-trim circuit, and a linearly scaled potentiometer in the output path of a differential amplifier in the fader circuit, and third gain curve 306 of a combined gain-trim and fader circuit with an anti-log scaled potentiometer in the feedback path of a fully differential amplifier in the gain-trim circuit, and an anti-log scaled potentiometer in the output path of the differential amplifier in the fader circuit, according to aspects of the embodiments.

First gain curve 302 is the gain of gain-trim circuit 100 alone without the influence or impact of fader circuit 200 (or circuit 400). First gain curve 302 shows that when turned to its lowest gain value, the output of FD-Amp 114 will be about +6 dB. As the shaft of potentiometer $R_{GT}$ 116 is turned (indicated by the relative position of control along the X axis), the gain increases non-linearly from about 6 dB to about 60 dB.

Second gain curve 304 is the gain of gain-trim circuit 100 with the influence of fader circuit 200 (or circuit 400). When fader circuit 200 (or 400) is added, according to aspects of the embodiments, the largest negative gain of fader circuit 200, which, only for purposes of this discussion, has been set to be about −90 dB (but which can be any value, including, by way of non-limiting example, about −100 dB), attenuates the output of fader circuit 200 to about −55 dB (i.e., when the shaft of $C_{GFC}$ 210 turned to its 0% relative position). When the gain is maximized by turning the shaft of $C_{GFC}$ 210 to its 100% relative position, the output of gain-trim circuit 100 is maximized (about 60 dB of gain), and the negative attenuation of fader circuit 200 is minimized (about 0 dB), so that the signal level output of fader circuit 200 is essentially the signal level output of gain-trim circuit 100 according to aspects of the embodiments. Second gain curve 304 illustrates the impact on the gain of the two circuits 100, 200 when $C_{GFC}$ 210 is adapted to be an anti-log potentiometer in gain-trim circuit 100 ($R_{GT}$ 116) and a liner potentiometer in fader circuit 200 ($R_F$ 204).

Third gain curve 306 of FIG. 3 illustrates the combined gain of gain-trim circuit 100 and fader circuit 200 when $C_{GFC}$ 210 is adapted to be anti-log potentiometer in gain-trim circuit 100 ($R_{GT}$ 116) and an anti-log potentiometer in fader circuit 200 ($R_F$ 204), according to aspects of the embodiments. According to aspects of the embodiments, when fader circuit 200 (or 400) is added using an anti-log potentiometer in its feedback path, the largest negative gain of fader circuit 200 attenuates the output of fader circuit 200 to about −55 dB (the shaft of $C_{GFC}$ 210 turned to its 0% relative position). When the gain is maximized by turning the shaft of $C_{GFC}$ 210 to its 100% relative position, the output of gain-trim circuit 100 is maximized (about 60 dB of gain), and the negative attenuation of fader circuit 200 is minimized (about 0 dB), so that the signal level output of fader circuit 200 is essentially the signal level output of gain-trim circuit 100. According to further aspects of the embodiments, the largest negative gain of fader circuit 200/400 can be about −90 dB, about −100 dB, or some other maximum attenuation value can also be used.

According to aspects of the embodiments, gain-trim curve 302 can be a natural logarithmic curve (from hereinafter, "log"). According to aspects of the embodiments, because of the way that FD-Amp 114 operates, and because $R_{GT}$ 116 is in the feedback path, the resistance of $R_{GT}$ 116 can be characterized in a response curve that is the inverse of the desired gain curve.

Thus, according to aspects of the embodiments, gain-trim circuit 100 and fader circuit 200 can be used in a product sold by Crestron Electronics, Inc., referred to as the MMX-6-USB 6 Channel USB Microphone Mixer (Crestron Mic Mixer). The Crestron Mic Mixer can employ an anti-log potentiometer in gain trim circuit 100 to achieve a log gain adjustment out of gain trim circuit 100 (note that because the anti-log potentiometer is in the feedback loop, the output is characterized as the inverse of the actual device in the feedback loop; the inverse of an anti-log potentiometer changing the voltage in the feedback loop means a log gain adjustment at the output), followed by another anti-log potentiometer in fader circuit 200 to achieve an anti-log gain adjustment out of fader circuit 200 as well. Thus, in this embodiment, the output of the Crestron Mic Mixer will have a log gain curve (third gain curve 306). According to further aspects of the embodiments, the Crestron Mic Mixer can also employ an anti-log potentiometer in gain trim circuit 100 to achieve a log gain adjustment out of that portion, followed by a linear potentiometer in fader circuit 200 to achieve a linear gain adjustment out of that portion as well. Thus, in this further embodiment, the Crestron Mic Mixer will have a combination of a log gain curve and a linear gain curve (second gain curve 304).

Attention is now directed to FIGS. 4, 5, and 6. FIG. 4 illustrates a detailed first partial view of an electrical schematic of gain-trim circuit 400 as shown in the block diagram of FIG. 1 according to aspects of the embodiments, FIG. 5 illustrates a detailed second partial view of the electrical schematic of gain-trim circuit 400 as shown in the block diagram of FIG. 1 according to aspects of the embodiments, and FIG. 6 illustrates a detailed electrical schematic of fader circuit 600 as shown in the block diagram of FIG. 2 according to aspects of the embodiments.

The circuit elements of FIGS. 4, 5, and 6 have been selected to substantially optimize operation of the circuits in regard to the expected frequency range and input signal levels of the microphone signals expected as inputs to circuit 400 according to aspects of the embodiments. Further, operation of several of the different circuit blocks (e.g., phantom voltage source, VPH 108a,b, circuit blocks 110, 112, 114, among others) are substantially well known to those of skill in the art, and therefore, in fulfillment of the dual purposes of clarity and brevity, a detailed discussion thereof has been omitted from herein.

In further regard to FD-Amp 114, a brief discussion will be made so as to illustrate the impact and effect of potentiometer $R_{GT}$ 116 on the gain according to aspects of the embodiments. FD-Amp 114 has both differential inputs and outputs. The gain of FD-Amp amplifier 114 is set by the combination of the feedback resistors, collectively referred to as "$R_{FB}$" (R 33 and R 34 in FIG. 5), and $R_{GT}$ 116. The gain in dB can be defined as:

$$\text{Gain, dB} = 20 \times \log_{10}\left(1 + \frac{2 \times R_{FB}}{R_{GT}}\right) \quad \text{Eq (1)}$$

Attention is now directed to FIG. 6. In FIG. 6, Diff-Amp 202 is a unity gain differential amplifier followed by the fader potentiometer, $R_F$ 204. As configured, $R_F$ 204 provides a familiar voltage divider. Moving the wiper results in effectively two resistors: the first resistor is $R_{F_a}$ 204a, and is the resistor connected between the output of Diff-Amp 202 and mic output 206, and the second resistor is $R_{F_b}$ 204b, the resistor connected between the wiper arm or mic output 206 and ground. In addition, a resistor $R_{Sign\text{-}Pres.}$ is also connected to the wiper arm; this resistor limits the current in a signal that is used to represent when a microphone signal has been received by the combined gain-trim and fader circuits 400, 600, according to aspects of the embodiments. The voltage at the wiper of $R_F$ 204 (the output terminal of the potentiometer, or mic output 206), is defined as follows:

$$V_{206} = V_{out} \times \frac{RFb}{RFa + RFb} = V_{out} \times \frac{RFb}{RF} \quad \text{Eq (2)}$$

The rotational position of $R_F$ 204, $P_{ROT}$, can be defined to vary between 0, fully counterclockwise, and 1, fully clockwise (or, according to further aspects of the embodiments, vice-versa). This leads to the following two cases:

(1) If potentiometer $R_F$ 204 has a linear taper:

$$V_{206} = V_{202} \times P_{ROT} \quad \text{Eq (3)}$$

(2) If potentiometer $R_F$ 204 has an anti-log taper:

$$V_{206} = V_{202} \times (-1.0125 \times e^{(-4.39445 \times P_{ROT})} + 1.0125) \quad \text{Eq(4)}$$

As those of skill in the art can appreciate, these equations are for ideal potentiometers. This would result in infinite attenuation at the fully counterclockwise position. In the real circuit, the potentiometers have residual resistance at full rotation that limits the realizable attenuation. The attenuation is further limited by the leakage paths in a real circuit. That is why the curves on the plot limit the attenuation to approximately 55 to 60 dB.

According to further aspects of the embodiments, gain-trim circuit 100 can be further adapted to variably attenuate the received differential mic output signals. Further, fader circuit 200 can be further adapted to variably amplify the received differential gain-trim circuit output signals.

According to still further aspects of the embodiments, $C_{GFC}$ 210 can be implemented in the form of an electronic potentiometer; that is, $C_{GFC}$ 210 can be embodied in the form of one or more digital potentiometers. A rotary or slide control position sensor can be implemented with the output fed into an analog to digital converter (ADC) to create a digital signal that can then be scaled appropriately to drive the digitally controlled digital potentiometer that controls the gain/loss of the gain-trim circuit and fader circuits, respectively, in a substantially similar manner as described above. According to further aspects of the embodiments, a digital position encoder can be used to create a digital signal that can then be scaled appropriately to drive the digitally controlled digital potentiometer that controls the gain/loss of the gain-trim circuit and fader circuits, respectively, in a substantially similar manner as described above, without the use of an ADC. Use of digital potentiometers provides several different benefits. For example, the gain/loss of the respective circuits can then be controlled remotely, either through use of a remote control device, or through a network via appropriate circuitry (transceivers, and the like). According to still further aspects of the embodiments, the use of digital potentiometers also substantially eliminates the effects of any offset in the mechanical position of the potentiometers or any difference in the angle of rotation. The mechanical offset, and/or difference in angle of rotation limits the ability of the circuit to achieve either the maximum possible gain, or the maximum possible attenuation. The digital potentiometers also permit the two ganged potentiometers to be placed farther from each other, which can improve isolation (maximum attenuation).

The disclosed embodiments provide systems, methods, and modes for simultaneously providing gain-trim and fader functions in pre-amplifier audio components. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes for simultaneously providing gain-trim and fader functions in pre-amplifier audio components.

Alternate Embodiments

Alternate embodiments may be devised without departing from the spirit or the scope of the different aspects of the embodiments.

What is claimed is:

1. A microphone mixer comprising:
an input adapted to receive differential microphone (mic) output signals;
a gain-trim circuit adapted to receive the differential mic output signals, and which includes
a substantially fully differential amplifier adapted to amplify the received differential mic output signals through use of a gain-trim output adjustment device that provides a variable gain amount ranging from a first gain-trim gain value to a second gain-trim gain value, to produce differential gain-trim circuit output signals;
a fader circuit adapted to receive the differential gain-trim circuit output signals, and which includes
a differential amplifier adapted to attenuate the received differential gain-trim circuit output signals through use of a fader output adjustment device that provides a variable gain amount ranging from a first fader gain value to a second fader value; and
a common adjustment apparatus that mechanically ties the gain-trim output adjustment device with the fader output adjustment device such that
the first gain-trim gain value and first fader gain value are obtained substantially simultaneously at a first position of the common adjustment apparatus, and
the second gain-trim gain value and second fader gain value are obtained substantially simultaneously at a second position of the common adjustment apparatus.

2. The microphone mixer according to claim 1, further comprising:
a plurality of filters adapted to provide a bandpass filter function such that only a predetermined frequency range of input signals is allowed to propagate through to the output of the microphone mixer.

3. The microphone mixer according to claim 1, wherein
the first gain-trim gain value is a lowest positive first gain-trim gain value,
the second gain-trim gain value is a highest positive gain-trim gain value,
the first fader gain value is a largest negative fader gain value, and
the second fader gain value is a fader gain value that does not substantially change the output of the fader circuit in view of the input of the fader circuit.

4. The microphone mixer according to claim 1, wherein
the gain-trim output adjustment device comprises a natural logarithmic scaled gain, and
the fader output adjustment device comprise a linearly scaled potentiometer.

5. The microphone mixer according to claim 1, wherein
the gain-trim output adjustment device comprises a natural logarithmic scaled gain, and
the fader output adjustment device comprise an anti-logarithmic scaled potentiometer.

6. The microphone mixer according to claim 1, wherein
the gain-trim circuit is further adapted to variably attenuate the received differential mic output signals.

7. The microphone mixer according to claim 1, wherein
the fader circuit is further adapted to variably amplify the received differential gain-trim circuit output signals.

* * * * *